United States Patent
Zhou

(10) Patent No.: US 10,658,512 B2
(45) Date of Patent: May 19, 2020

(54) FIN FIELD EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CA)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/117,051

(22) Filed: Aug. 30, 2018

(65) Prior Publication Data

US 2019/0081169 A1 Mar. 14, 2019

(30) Foreign Application Priority Data

Sep. 11, 2017 (CN) .......................... 2017 1 0812750

(51) Int. Cl.
| H01L 21/336 | (2006.01) |
|---|---|
| H01L 29/78 | (2006.01) |
| H01L 29/66 | (2006.01) |
| H01L 21/02 | (2006.01) |
| H01L 21/28 | (2006.01) |
| H01L 29/423 | (2006.01) |
| H01L 27/088 | (2006.01) |
| H01L 29/786 | (2006.01) |
| H01L 21/8234 | (2006.01) |

(52) U.S. Cl.
CPC ........ *H01L 29/785* (2013.01); *H01L 21/0228* (2013.01); *H01L 21/28008* (2013.01); *H01L 21/823431* (2013.01); *H01L 27/0886* (2013.01); *H01L 29/42392* (2013.01); *H01L 29/6681* (2013.01); *H01L 29/66439* (2013.01); *H01L 29/66545* (2013.01); *H01L 29/78696* (2013.01); *H01L 21/28238* (2013.01); *H01L 2029/7858* (2013.01)

(58) Field of Classification Search
CPC ......... H01L 21/28008; H01L 29/66545; H01L 21/0228
See application file for complete search history.

(56) References Cited

U.S. PATENT DOCUMENTS

2016/0240652 A1* 8/2016 Ching ................... H01L 29/785

* cited by examiner

*Primary Examiner* — Samuel A Gebremariam
(74) *Attorney, Agent, or Firm* — Anova Law Group, PLLC

(57) ABSTRACT

A fabrication method for a fin field effect transistor is provided. The method includes forming a base substrate including a substrate and fins protruding from the substrate. The substrate includes a first region and a second region. The fins include at least a first fin protruding from the substrate in the first region, and at least a second fin protruding from the substrate in the second region. The second fin includes a sacrificial layer and a semiconductor layer covering the sacrificial layer. Then a first dummy gate oxidation layer is formed on a portion of the first fin by an in-situ steam generation (ISSG)-decoupled plasma nitrogen (DPN) treatment process. A second dummy gate oxidation layer is formed on a portion of the second fin by an atomic layer deposition process.

20 Claims, 15 Drawing Sheets

US 10,658,512 B2

FIN FIELD EFFECT TRANSISTOR AND FABRICATION METHOD THEREOF

CROSS-REFERENCES TO RELATED APPLICATION

This application claims the priority of Chinese Patent Application No. 201710812750.2, filed on Sep. 11, 2017, the content of which is incorporated herein by reference in its entirety.

TECHNICAL FIELD

The present disclosure generally relates to the field of semiconductor technologies and, more particularly, relates to a fin field effect transistor (FinFET) and its fabrication method.

BACKGROUND

In semiconductor technologies, especially ultra-large integrated circuits, critical dimensions of the integrated circuits continuously decrease. A length of a channel in a metal-oxidation-semiconductor transistor (MOSFET) also continuously decreases. As the length of the channel in the MOSFET continuously decreases, a distance between a source and a drain also continuously decreases. Correspondingly, a gate in the MOSFET has a weaker controlling ability on channel currents, and it is more difficult for a gate voltage to pinch off the channel. A subthreshold leakage effect, i.e., a short-channel effect, occurs more easily.

To better adapt to the continuously-decreased critical dimensions, the semiconductor technology has gradually moved from planar MOSFETs to more effective non-planar three-dimensional transistors, such as fin field effect transistors (FinFETs). In a FinFET, a gate structure can control an ultra-thin part (a fin) at least from two sides of the fin, to provide a much stronger controlling ability on channels and to effectively suppress the short-channel effect. Moreover, in comparison with other devices, a FinFET is more compatible with present fabrication processes for integrated circuits. To continuously improve a driving ability of a current and suppress the short channel effect, technical nodes continuously decrease and conventional FinFETs cannot meet requirements of the continuously-decreased technical nodes. Gate-all-around (GAA) FinFETs are used to achieve a higher integration level and to further suppress the short channel effect.

A FinFET device usually includes core devices and I/O devices, having different semiconductor structures. The core devices usually include GAA structures. When forming GAA structures for the core devices, to improve performances of the I/O devices, fins in the I/O devices and fins in the core devices are simultaneously treated by an in-situ steam generation (ISSG)-decoupled plasma nitrogen (DPN) process, to form dummy gate oxidation layers. These high-temperature thermal oxygen treatments may induce a diffusion/migration of a material of sacrificial layers in the fin of the core devices. The formed FinFET may have a poor performance.

SUMMARY

One aspect of the present disclosure provides a fabrication method of a fin field effect transistor (FinFET). The method includes forming a base substrate including a substrate and fins protruding from the substrate. The substrate includes a first region and a second region. The fins include at least a first fin protruding from the substrate in the first region, and at least a second fin protruding from the substrate in the second region, and the second fin includes a sacrificial layer and a semiconductor layer covering the sacrificial layer. A first dummy gate oxidation layer is formed on a portion of the first fin by an in-situ steam generation-decouple plasma nitrogen treatment process, and a second dummy gate oxidation layer is formed on a portion of the second fin.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-9 illustrate semiconductor structures corresponding to certain stages for forming a FinFET.

Figure 1:
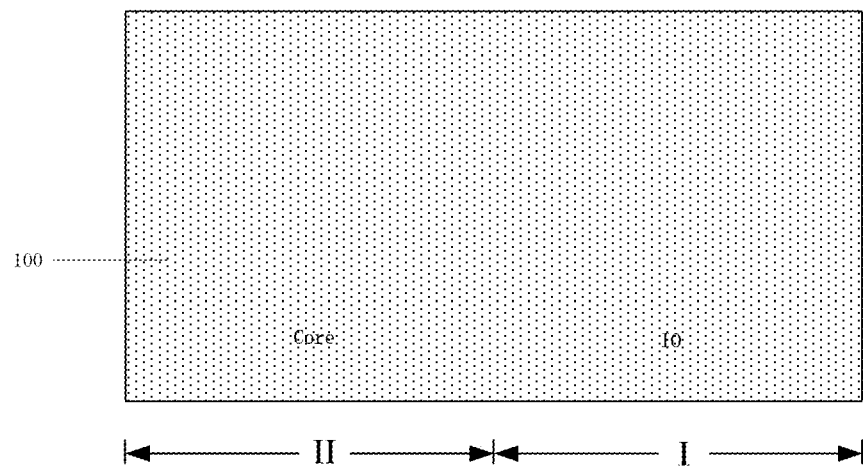
FIG. 1 to FIG. 9 illustrate semiconductor structures corresponding to certain stages for forming a fin field-effect transistor (FinFET) device.

Referring to FIG. 1, a base substrate 100 may be provided. The base substrate 100 may include a first region I and a second region II. The first region I may be used to form an I/O device, and the second region II may be used to form a core device.

Figure 2:
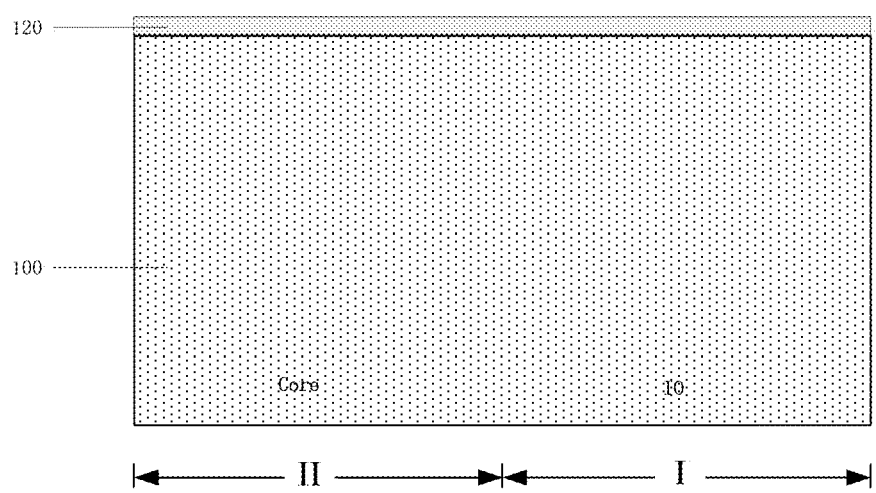

Referring to FIG. 2, a cap layer 120 may be formed on the base substrate 100.

Figure 3:
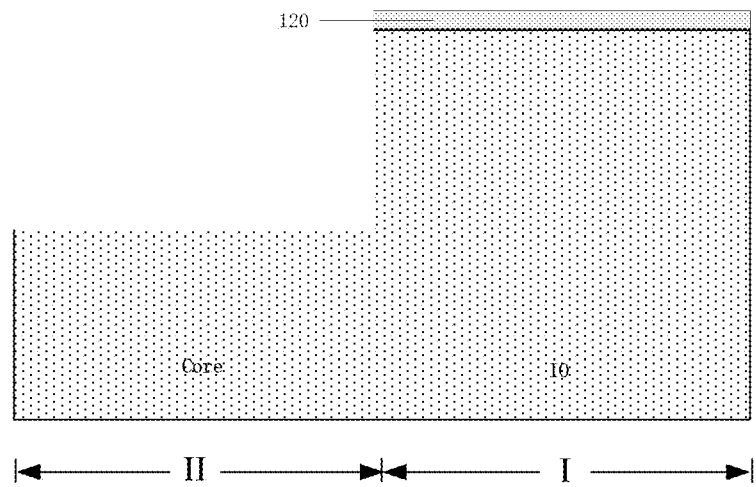

Referring to FIG. 3, a portion of the substrate material in the second region II may be removed by etching, to form a recess.

Figure 4:
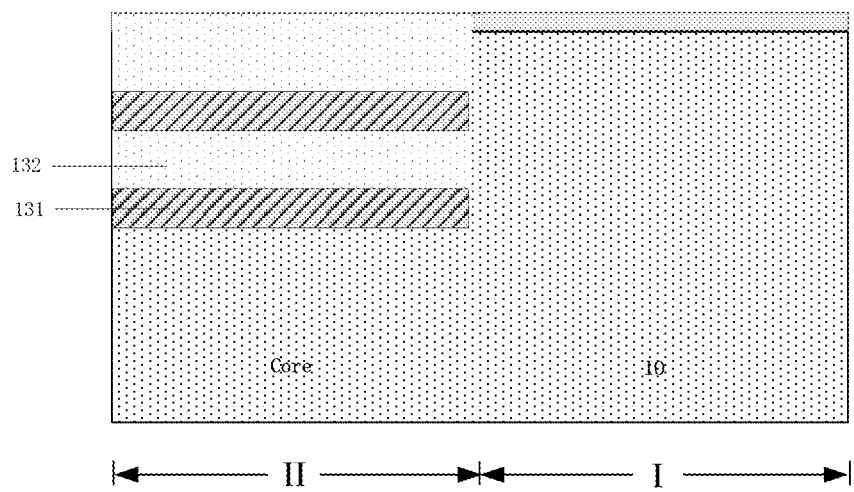

Referring to FIG. 4, in the recess formed by removing a portion of the substrate material in the second region II, SiGe sacrificial layers 131 and Si semiconductor layers 132 may be formed alternately by epitaxial growth processes.

Figure 5:
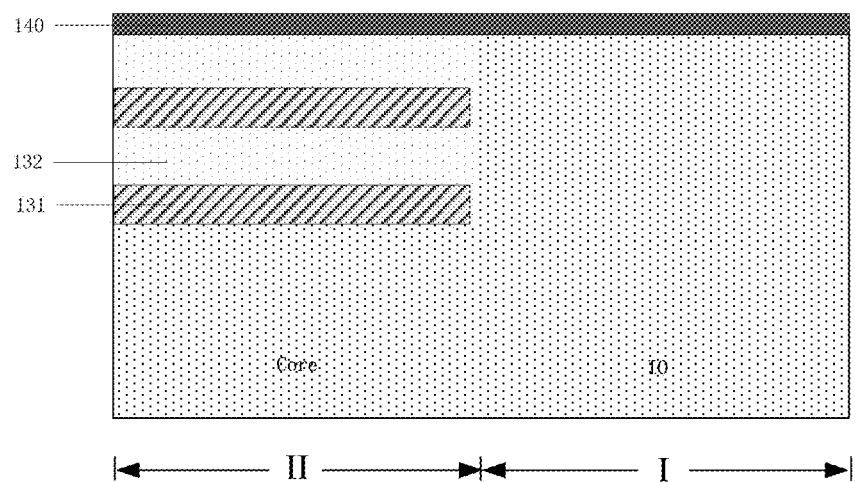

Referring to FIG. 5, after the epitaxial growth processes, the base substrate 100 may be planarized to remove the cap layer 120, and then a SiN cap layer 140 may be formed on the base substrate 100.

Figure 6:
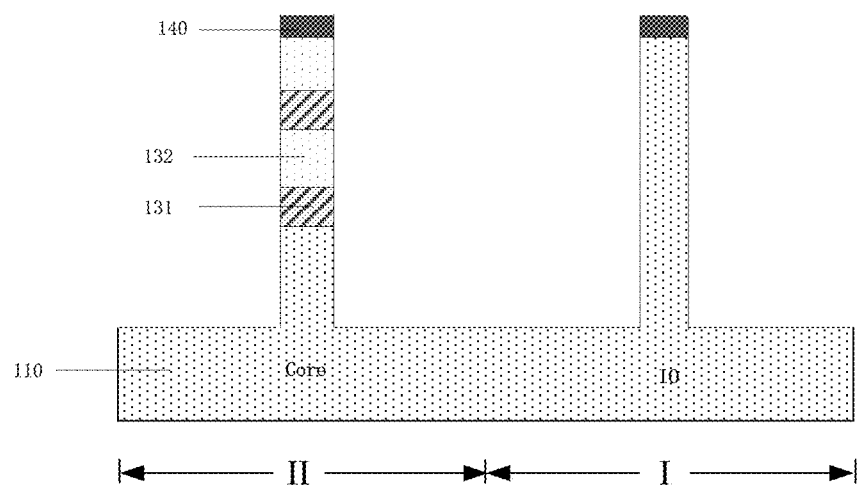

Referring to FIG. 6, the base substrate 100 may be etched to form a substrate 110. In the substrate 110, a first fin and a second fins may be formed in the first region I and in the second region II respectively. The second fins may include the SiGe sacrificial layers 131 and the silicon semiconductor layers 132 which are arranged alternately.

Figure 7:
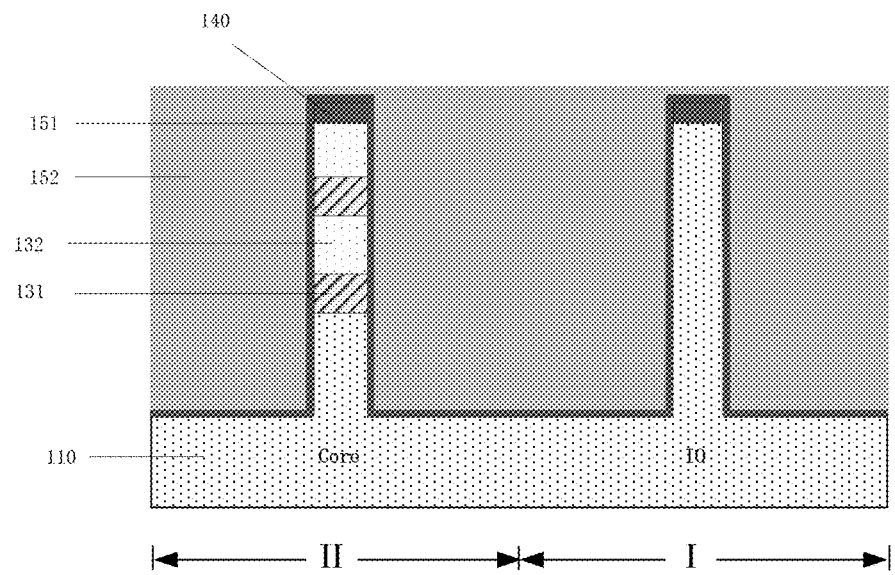

Referring to FIG. 7, an oxidation dielectric layer may be formed on the substrate 110. The oxidation dielectric layer may include a liner oxidation layer 151 and an oxidation filling layer 152 to fill grooves.

Figure 8:
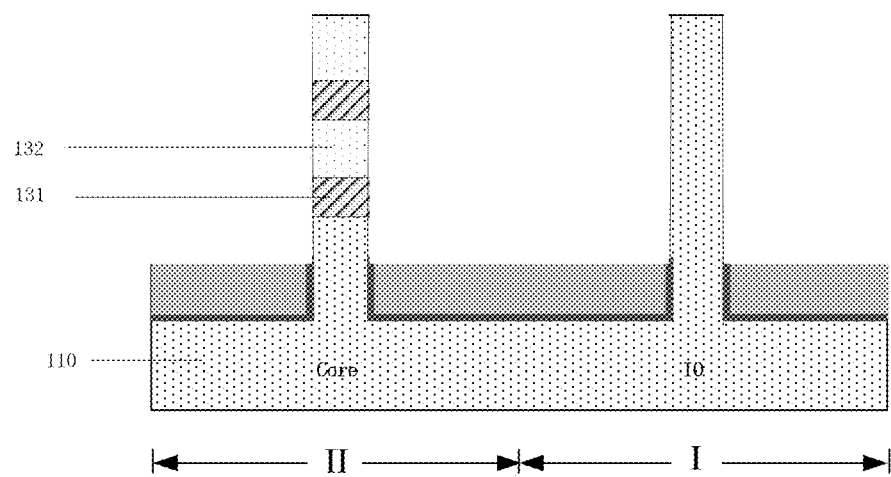

Referring to FIG. 8, a portion of the oxidation dielectric layer in the first region I and in the second region II may be removed by etching, to expose a portion of the first fin and a portion of the second fins.

Figure 9:
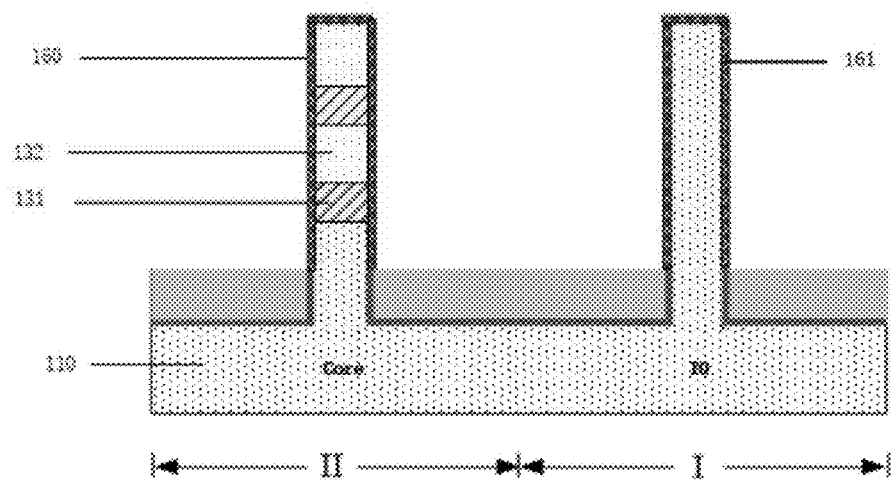

Referring to FIG. 9, a first dummy gate oxidation layer 161 may be formed on an exposed portion of the first fin, and a second dummy gate oxidation layer 160 may also be formed on an exposed portion of the second fin, by an in-situ steam generation (ISSG)-decoupled plasma nitrogen (DPN) treatment process.

The first dummy gate oxidation layer may be formed on the exposed portion of the first fin by the ISSG-DPN process, which can guarantee a performance of the I/O device formed in the first region I. When forming the first dummy gate oxidation layer on the exposed portion of the first fin by the ISSG-DPN process, the process uses a high-temperature thermal oxidization treatment, and germanium in the SiGe sacrificial layers may diffuse/migrate into the silicon semiconductor layers easily. The core device formed in the second region II has a poor performance.

The present disclosure provides a FinFET and the fabricating method. The method may include providing a base substrate including a substrate and fins protruding from the substrate. The substrate may include a first region and a second region. The fins may include at least a first fin protruding from the substrate in the first region, and at least a second fin protruding from the substrate in the second region. The second fin may include sacrificial layers and semiconductor layers covering the sacrificial layers. The sacrificial layers and the semiconductor layers may be arranged alternately. Then a first dummy gate oxidation layer may be formed on a portion of the first fin by an in-situ steam generation and decoupled plasma nitrogen (ISSG-DPN) treatment process. After forming the first dummy gate oxidation layer, a second dummy gate oxidation layer may be formed on a portion of the second fin. The second dummy gate oxidation layer may be formed by an atomic layer deposition process, to make the process control easy.

In the present disclosure, the first dummy gate oxidation layer may be formed on a portion of the first fin by the ISSG-DPN process, and the second dummy gate oxidation layer may be formed on a portion of the second fin by the atomic layer deposition process. On the second fin, the atomic layer deposition process may be used to form the second dummy gate oxidation layer instead of the ISSG-DPN process, to avoid a high-temperature thermal oxidation treatment. Correspondingly, a diffusion/migration of germanium from the SiGe sacrificial layers to the silicon semiconductor layers may be avoided.

Figure 26:
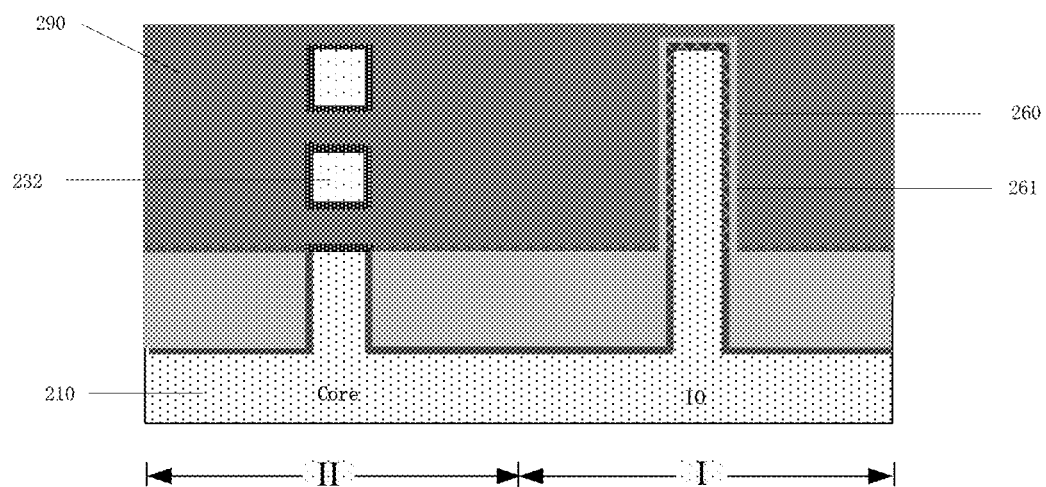
Figure 27:
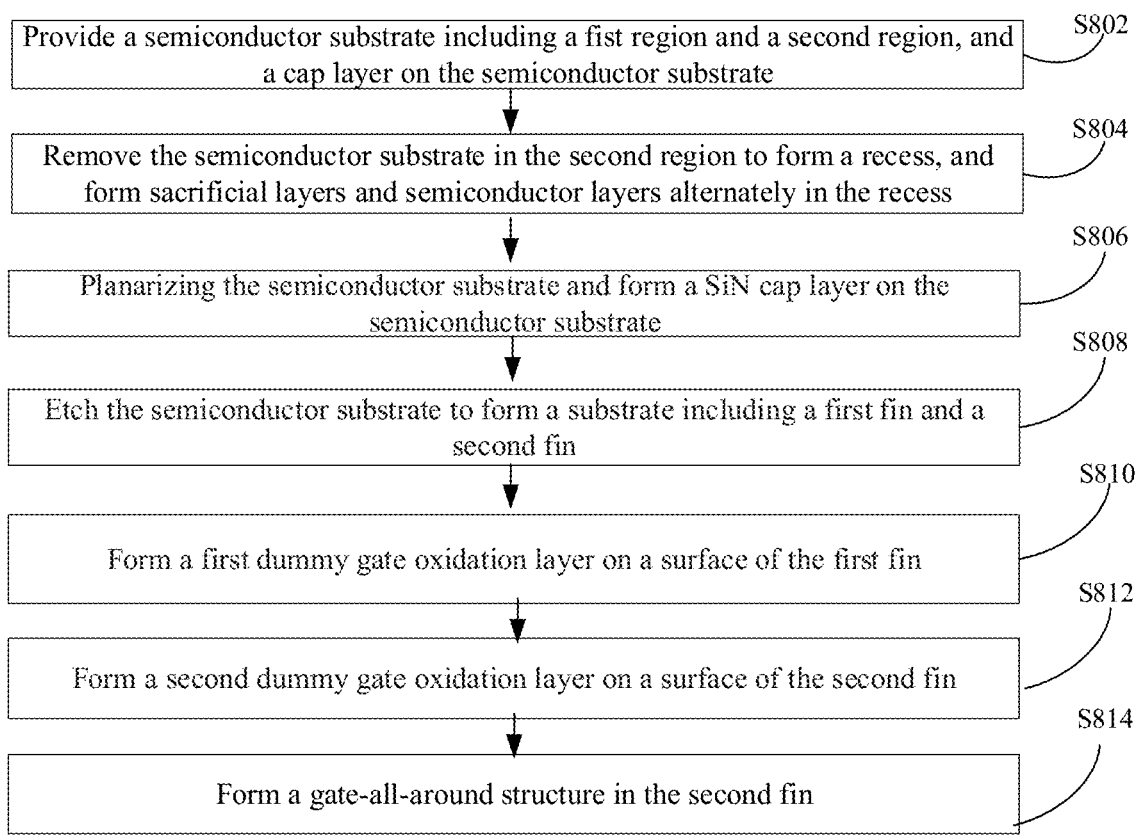
FIG. 27 illustrates an exemplary method for forming a FinFET device according to various disclosed embodiments of the present disclosure.

FIGS. 10-26 illustrate semiconductor structures corresponding to certain stages for forming an exemplary FinFET according to various disclosed embodiments of the present disclosure; and FIG. 27 illustrates an exemplary method for forming a FinFET according to various disclosed embodiments of the present disclosure.

Figure 10:
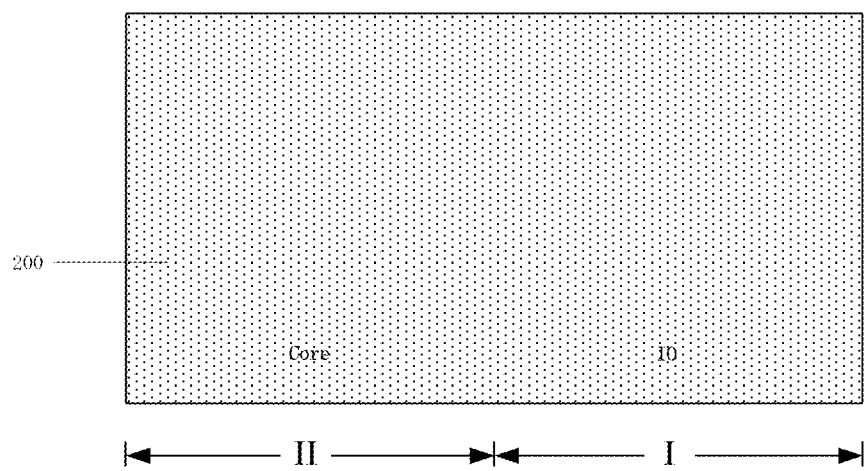
FIGS. 10-26 illustrate semiconductor structures corresponding to certain stages for forming an exemplary FinFET according to various disclosed embodiments of the present disclosure.

Referring to FIG. 10, a base substrate 200 may be provided (e.g. in Step S802 in FIG. 27). The base substrate 200 may include a first region I and a second region II. The first region I may be used to form an I/O device, and the second region II may be used to form a core device.

Figure 11:
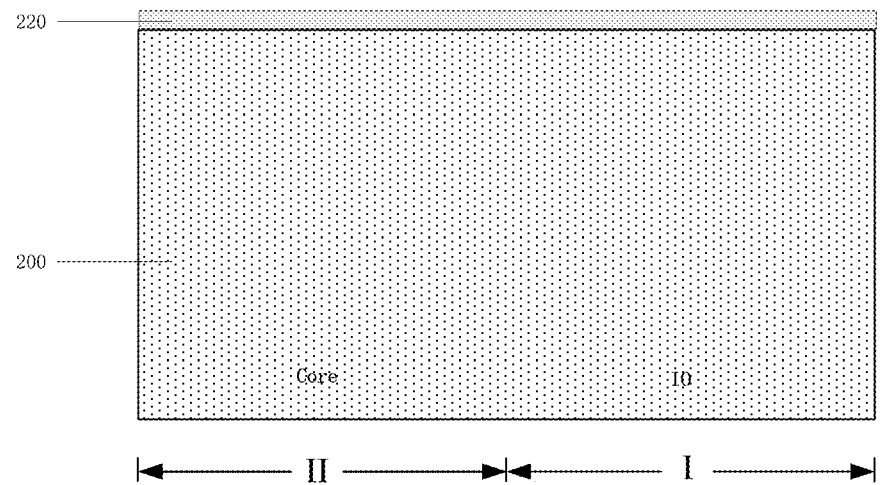

Referring to FIG. 11, a cap layer 220 may be formed on the base substrate 200.

Figure 12:
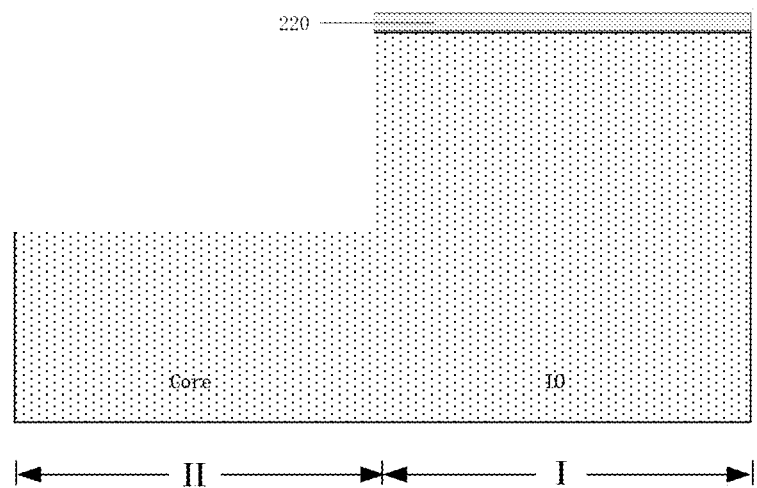

Referring to FIG. 12, a portion of the base substrate material in the region II may be removed by etching to form a recess.

Figure 13:
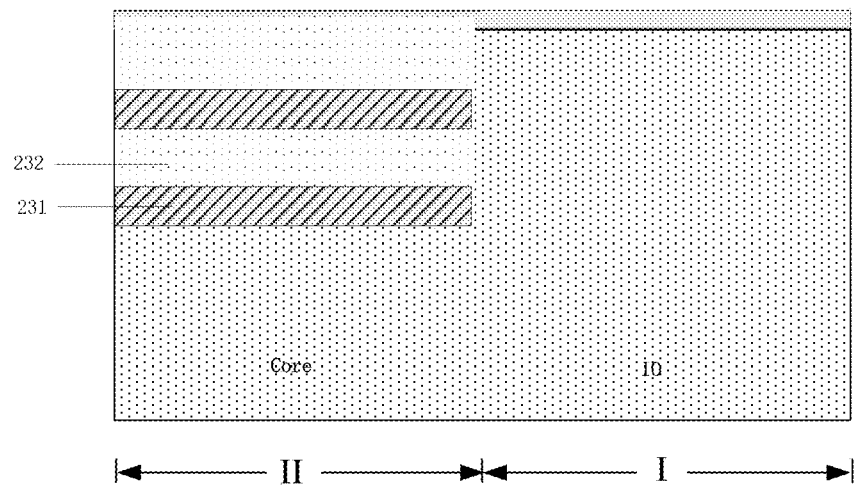

Referring to FIG. 13, in the recess formed by removing a portion of the base substrate material in the second region II, sacrificial layers 231 and semiconductor layers 232 may be formed alternately by epitaxial growth processes (e.g., in Step S804 in FIG. 27).

Figure 14:
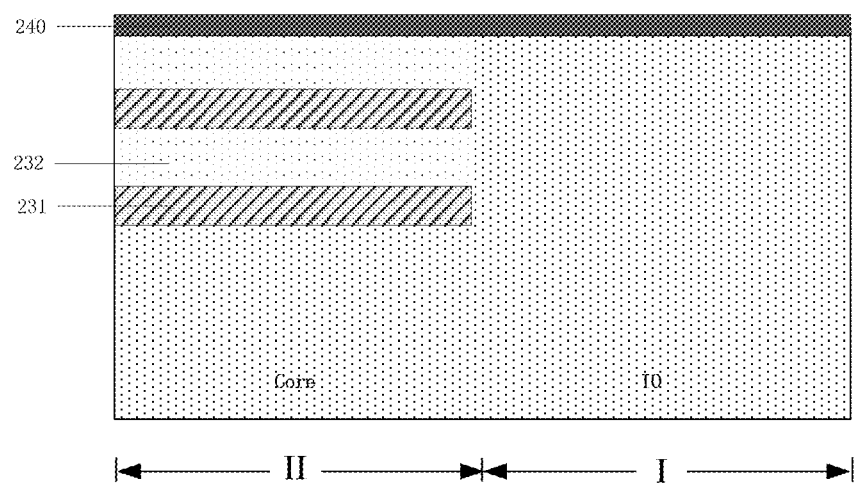

Referring to FIG. 14, after the epitaxial growth processes, the base substrate 200 may be planarized to remove the cap layer 220, and then a SiN cap layer 240 may be formed on the base substrate 200 (e.g., in Step S806 in FIG. 27).

Figure 15:
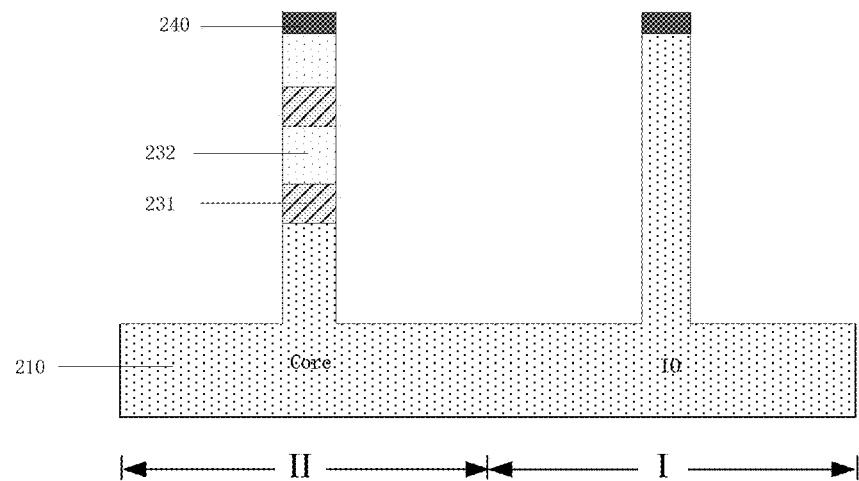

Referring to FIG. 15, the base substrate 200 may be etched to form a substrate 210 (e.g., in Step S808 in FIG. 27). In the substrate 210, a fin protruding from the substrate 210 in the first region I may be used as a first fin, and a fin protruding from the substrate 210 in the second region II may be used as a second fin. The second fins may include the sacrificial layers 231 and the semiconductor layers 232 covering the sacrificial layers 231. The sacrificial layers 231 and the semiconductor layers 232 may be arranged alternately.

In one embodiment, the second fin may include two sacrificial layers 231. In other embodiments, the second fin may include one sacrificial layer 231, three or more sacrificial layers 231.

The base substrate 200 may be a silicon base substrate, a SiGe base substrate, a SiC base substrate, a silicon-on-an-insulator (SOI) base substrate, a germanium-on-an-insulator (GOI) base substrate, a glass base substrate, or an III-V compound (such as SiN and GaAs) base substrate.

The first fin may be made of a material including silicon, germanium, SiGe, SiC, GaAs, and/or InGa.

The semiconductor layers 232 in the second fin may be made of a material including silicon, germanium, SiGe, SiC, GaAs, and/or InGa. The sacrificial layers 231 in the second fin may be made of a material which is different from the material of the semiconductor layers and is easy to be removed. In one embodiment, the semiconductor layers 232 may be made of silicon and the sacrificial layers 232 may be made of SiGe. In the sacrificial layers, a mass ratio of germanium may be about 30% to about 80%, to make the sacrificial layers easy to be removed.

Figure 16:
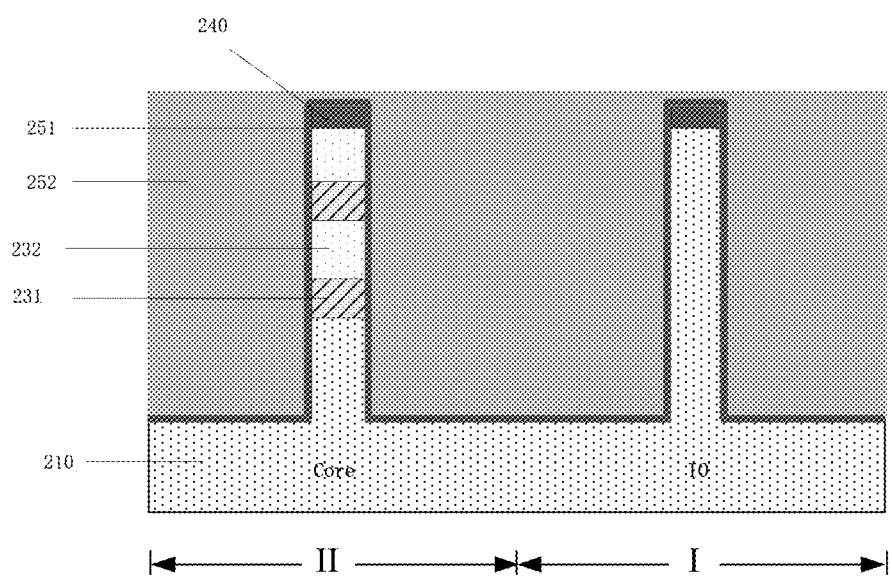

Referring to FIG. 16, an oxidation dielectric layer may be formed on the substrate 210. The oxidation dielectric layer may include a liner oxidation layer 251 and an oxidation filling layer 252 on the liner oxidation layer 251. The oxidation dielectric layer may cover the fins and may fill recesses between the fins.

The oxidation dielectric layer may be made of a material including $SiO_2$, $SiN_xO_y$, and/or SiHO.

Figure 17:
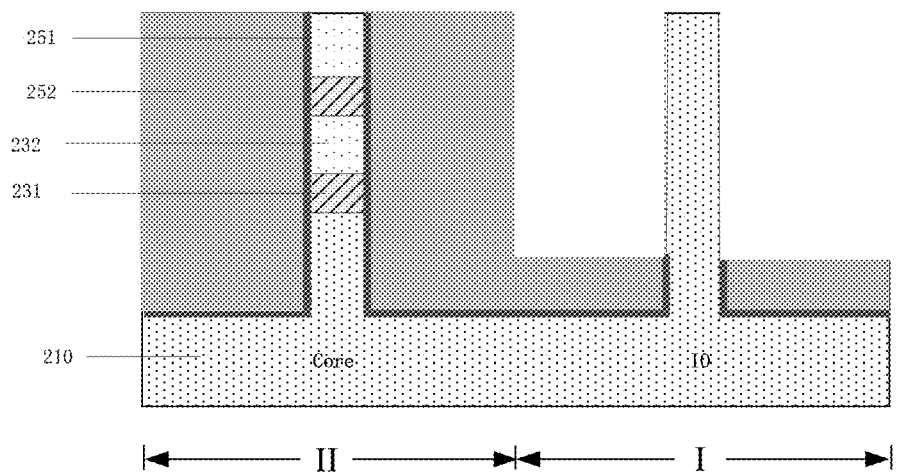

Referring to FIG. 17, a portion of the oxidation dielectric layer in the first region I may be removed to expose a portion of the first fin.

A portion of the oxidation dielectric layer in the first region may be removed by: forming a first mask layer on the surface of the oxidation dielectric layer in the second region II; etching away a portion of the oxidation dielectric layer in the first region I; and removing the first mask layer.

The first mask layer may be made of a photoresist and may be removed by a wet photoresist removing process or an ashing process.

Figure 18:
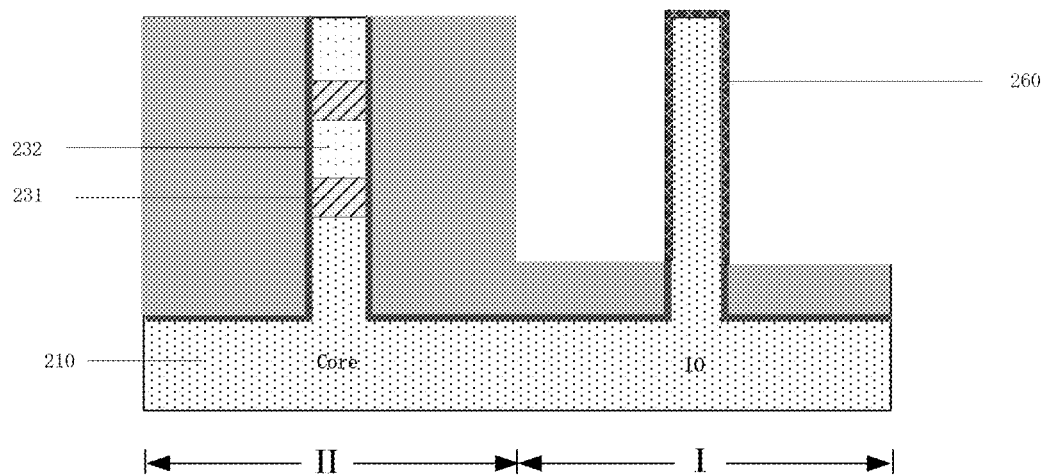

Referring to FIG. 18, a first dummy gate oxidation layer 260 may be formed on an exposed portion of the first fin, by the ISSG-DPN process (e.g., in Step S810 in FIG. 27).

The ISSG-DPN process may include: a plasmarization power of about 300 W to about 600 W, a plasma pressure of about 10 mTorr to about 30 mTorr, and a plasma gas including $N_2$, He, or a combination thereof, where $N_2$ has a flow rate of about 50 sccm to about 120 sccm and He has a flow rate of about 80 sccm to about 150 sccm.

Figure 19:
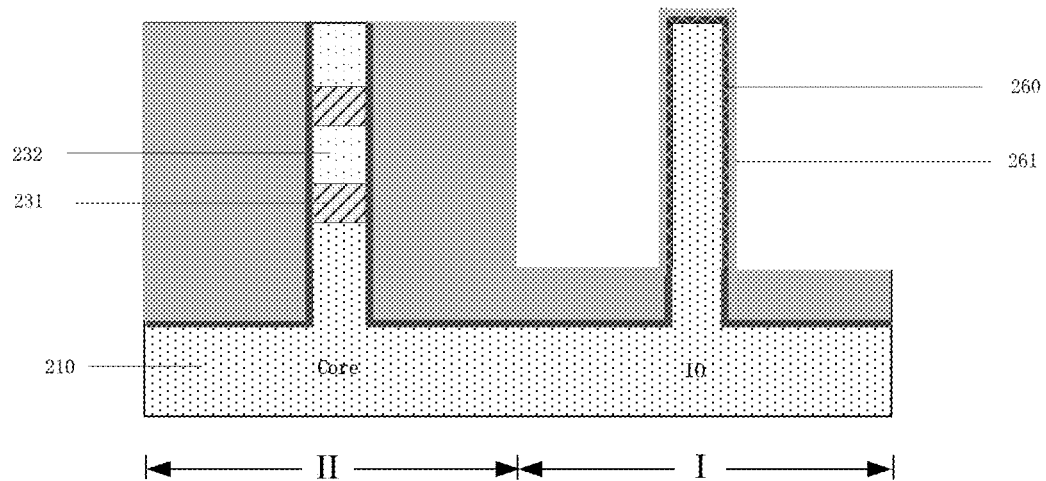

Referring to FIG. 19, a protection layer 261 may be formed on the first dummy gate oxidation layer 260. The protection layer 261 may be made of a material including $SiO_2$, $SiN_xO_y$, and/or SiHO.

The protection layer 261 may be formed by a deposition process including an atomic layer deposition process, a low-pressure chemical vapor deposition process, and/or a plasma-enhanced chemical vapor deposition process.

Figure 20:
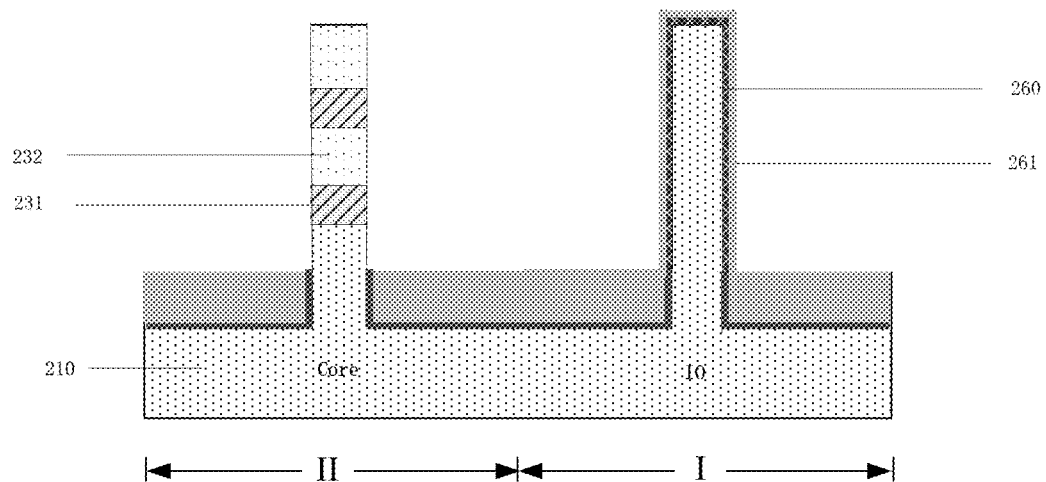

Referring to FIG. 20, a portion of the oxidation dielectric layer in the second region II may be removed to expose a portion of the second fin.

A portion of the oxidation dielectric layer in the second region II may be removed by: forming a second mask layer on the surface of the oxidation dielectric layer in the first region I and on the surface of the first fin; etching away a portion of the oxidation dielectric layer in the second region II; and removing the second mask layer.

The second mask layer may be made of a photoresist and may be removed by a wet photoresist removing process or an ashing process.

Figure 21:
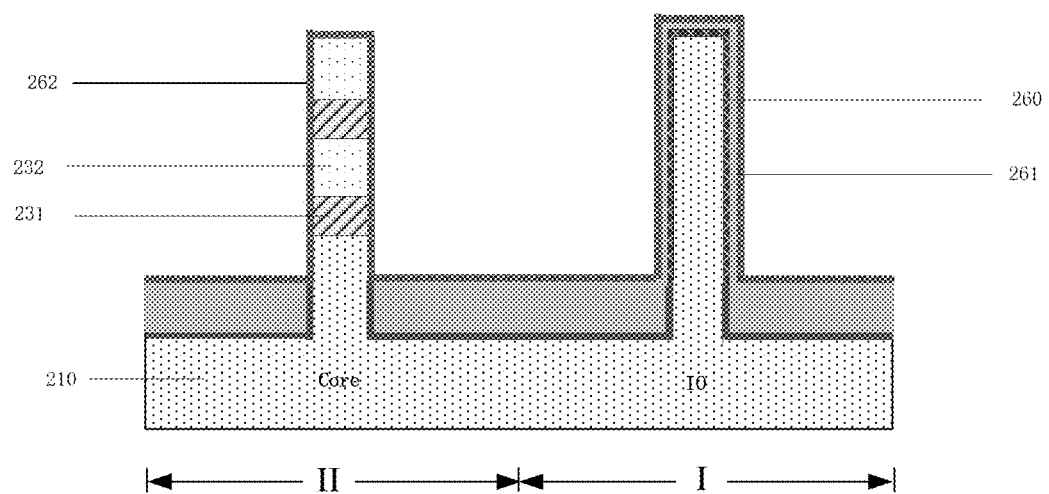

Referring to FIG. 21, a second dummy gate oxidation layer 262 may be formed on an exposed portion of the second fin by an atomic layer deposition process (e.g., in Step S812 in FIG. 27).

The atomic layer deposition process for forming the second dummy gate oxidation layer 262 may be performed with: a precursor including silicon and oxygen in an atomic layer deposition chamber, a temperature of about 80° C. to about 300° C., a pressure of about 500 mTorr to about 10 Torr, and a deposition time of about 5 times to about 50 time.

The method may further include forming a gate-all-around structure in the second fin (e.g. in Step S814 in FIG. 27).

Figure 22:
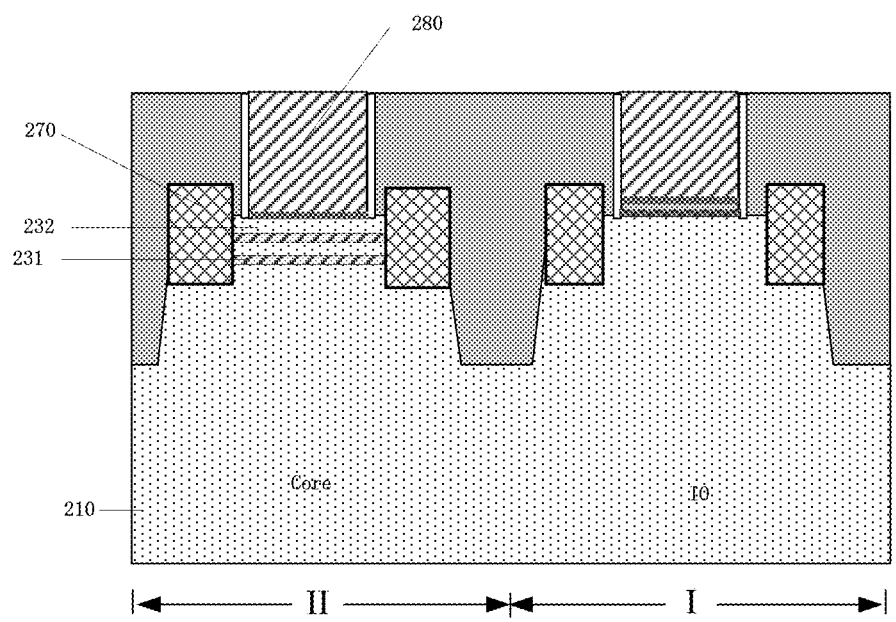

Referring to FIG. 22, second source/drain doped regions 270, a second dummy gate structure, and an oxidation dielectric layer filling recesses between the fins may be formed.

The second dummy gate structure may include a second dummy gate 280.

The second source/drain doped regions 270 may be formed by: forming grooves in the substrate on sides of each second dummy gate structure; forming strain layers in the grooves by epitaxial growth processes; and doping the strain layers with ions to form the second source/drain doped regions 270.

The oxidation dielectric layer filling the recesses between the fins may be formed by: filling the recesses between the fins with an oxidation dielectric material to cover the second dummy gate 280; and planarizing the oxidation dielectric material to expose the second dummy gate 280.

Figure 23:
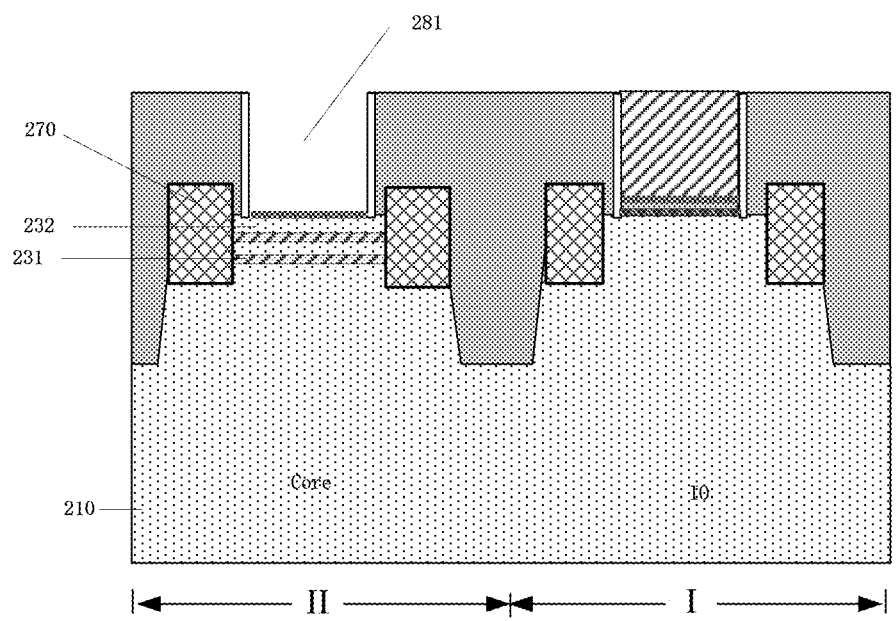

Referring to FIG. 23, the second dummy gate structure, i.e., the second dummy gate 280, may be removed by an etching process, to form a second opening 281 (e.g. in Step S814 in FIG. 27).

Figure 24:
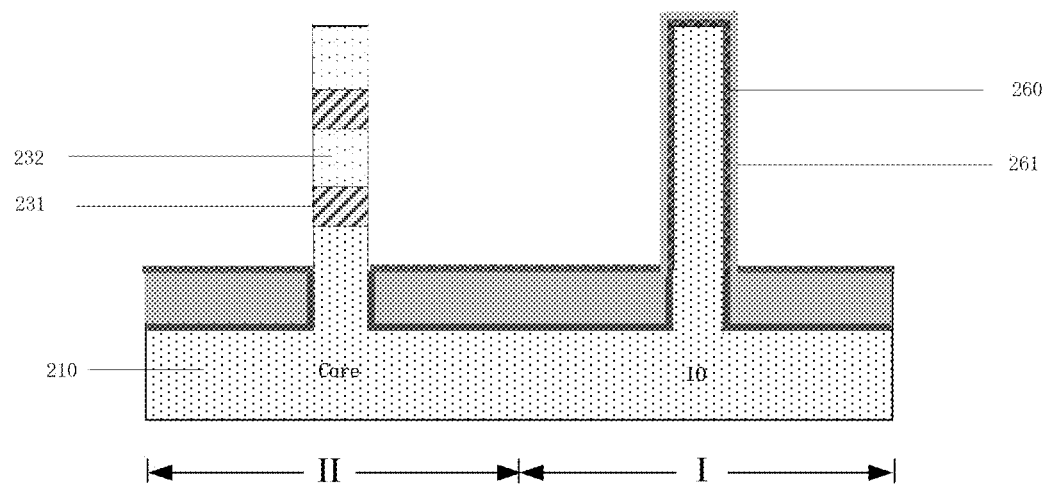

Referring to FIG. 24, a portion of the oxidation dielectric layer filling the recesses between the fins may be removed by etching, to expose all of the sacrificial layers 231.

Figure 25:
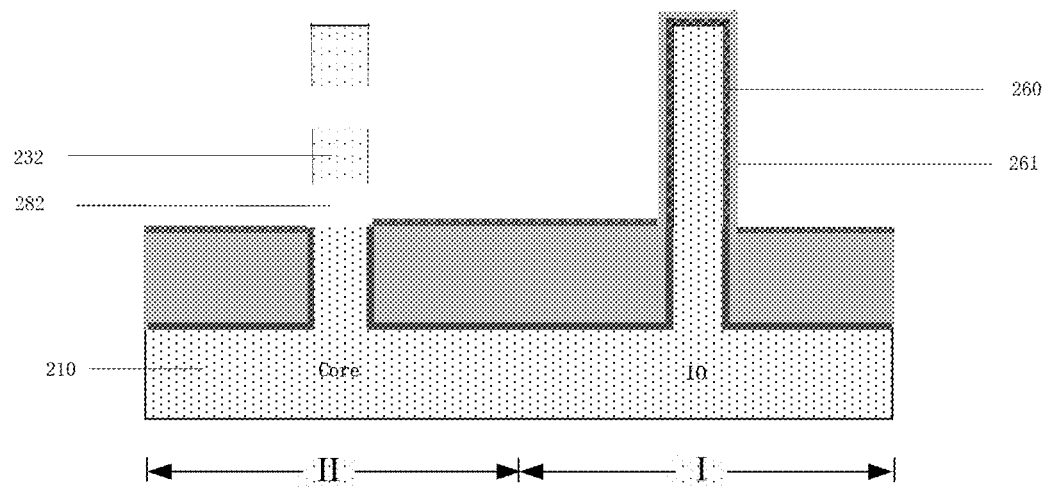

Referring to FIG. 25, a third mask layer may be formed on the surface of the substrate excluding the sacrificial layers 231 in the second fin, and then the sacrificial layers 231 in the second fins may be removed by etching with the third mask layer as a mask, to form interlayer tunnels 282. Subsequently, the third mask layer may be removed. The third mask layer may be made of a photoresist and may be removed by a wet photoresist removing process or an ashing process.

Referring to FIG. 26, a high-K gate dielectric layer, a work function metal layer, and a gate metal layer 290 may be sequentially formed in the second opening 281 and in the interlayer tunnels 281, to form the gate-all-around structure (e.g. in Step S814 in FIG. 27).

The high-K gate dielectric layer may be made of a material with a dielectric constant higher than the dielectric constant of $SiO_2$, including $HfO_2$, HfSiO, HfSiON, HMO, HfSiO, HfZrO, $ZrO_2$, and/or $Al_2O_3$.

The work function metal layer may be a P-type work function metal layer or an N-type work function metal layer.

The gate metal layer 290 may be made of a material including W, Al, Cu, Ag, Au, Pt, Ni, and/or Ti.

In the present disclosure, the first dummy gate oxidation layer may be formed on an exposed portion of the first fin by the ISSG-DPN process, and the second dummy gate oxidation layer may be formed on an exposed portion of the second fin by the atomic layer deposition process. On the surface of the second fin, the atomic layer deposition process may be used to form the second dummy gate oxidation layer instead of the ISSG-DPN process, to avoid a high-temperature thermal oxidation. Then a diffusion/migration of germanium from the SiGe sacrificial layers to the semiconductor layers may be avoided. The performance of the formed semiconductor structure may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a fin field effect transistor, comprising:
   forming a base substrate including a substrate and fins protruding from the substrate, wherein:
     the substrate includes a first region and a second region;
     the fins include at least a first fin protruding from the substrate in the first region, and at least a second fin protruding from the substrate in the second region; and
     the second fin includes a sacrificial layer and a semiconductor layer covering the sacrificial layer;
   forming a first dummy gate oxidation layer on a portion of the first fin by an in-situ steam generation-decouple plasma nitrogen (ISSG-DPN) treatment process; and
   forming a second dummy gate oxidation layer on a portion of the second fin.

2. The method according to claim 1, wherein:
   the second dummy gate oxidation layer is formed by an atomic layer deposition process.

3. The method according to claim 2, wherein:
   the atomic layer deposition process for forming the second dummy gate oxidation layer is performed with:
   a precursor including silicon and oxygen, introduced in an atomic layer deposition chamber;
   a temperature of about 80° C. to about 300° C.;
   a pressure of about 500 mTorr to about 10 Torr; and
   a deposition time of about 5 times to about 50 times.

4. The method according to claim 1, further including:
   before forming the first dummy gate oxidation layer, forming an oxidation dielectric layer on the substrate to cover the fins, and removing a first portion of the oxidation dielectric layer in the first region to expose the portion of the first fin;

forming the first dummy gate oxide layer on the portion of the first fin by the in-situ steam generation-decouple plasma nitrogen (ISSG-DPN) treatment process; and after forming the first dummy gate oxidation layer but before forming the second dummy gate oxidation layer, removing a second portion of the oxidation dielectric layer in the second region to expose the portion of the second fin, and forming the second dummy gate oxidation layer on the portion of the second fin.

5. The method according to claim 1, wherein the sacrificial layer of the second fin is made of a material including SiGe.

6. The method according to claim 5, wherein: in the sacrificial layer of the second fin, a mass ratio of germanium is about 30% to about 85%.

7. The method according to claim 1, wherein: the semiconductor layer of the second fin is made of a material including silicon.

8. The method according to claim 1, wherein: the first fin is made of a material including silicon.

9. The method according to claim 1, wherein: the in-situ steam generation-decouple plasma nitrogen (ISSG-DPN) treatment process for forming the first dummy gate oxidation layer is performed with:

a plasmarization power of about 300 W to about 600 W;

a plasma pressure of about 10 mTorr to about 30 mTorr; and a plasma gas including $N_2$, He, or a combination thereof, wherein $N_2$ has a flow rate of about 50 sccm to about 120 sccm and He has a flow rate of about 80 sccm to about 150 sccm.

10. The method according to claim 1, wherein: the first region includes an I/O device; and the second region includes a core device.

11. The method according to claim 1, before removing the second portion of the oxidation dielectric layer in the second region, further including:

forming a protection layer on the first dummy gate oxidation layer.

12. The method according to claim 11, wherein the protection layer is formed by an atomic layer deposition layer.

13. The method according to claim 1, wherein the base substrate is made of a material including silicon.

14. The method according to claim 1, wherein the first portion of the oxidation dielectric layer in the first region is removed by:

forming a first mask layer on the surface of the oxidation dielectric layer in the second region;

etching away the first portion of the oxidation dielectric layer in the first region; and removing the first mask layer.

15. The method according to claim 1, wherein the second fin is formed by:

removing a portion of the base substrate material in the second region to form a recess;

in the recess, forming the sacrificial layer and the semiconductor layer alternately; and forming the second fin by etching the base substrate.

16. The method according to claim 15, wherein: the sacrificial layer and the semiconductor layer are formed by epitaxial growth processes.

17. The method according to claim 1, further including: forming a gate-all-around structure in the second fin.

18. The method according to claim 17, wherein: the gate-all-around structure is formed by:

forming a second dummy gate structure in the second fin;

removing a dummy gate in the second dummy gate structure to form a second opening;

removing the sacrificial layer in the second fin to form an interlayer tunnel between the semiconductor layer;

forming a high-K gate dielectric layer, a work function metal layer, and a gate metal layer sequentially, to form the gate-all-around structure.

19. The method according to claim 18, wherein: the high-K gate dielectric layer, the work function metal layer, and the gate metal layer, are formed by epitaxial growth processes.

20. The method according to claim 19, wherein: the high-K gate dielectric layer is made of a material including $HfO_2$, HfSiO, HfSiON, HfTaO, HfTiO, HfZrO, $ZrO_2$, $Al_2O_3$, or a combination thereof.

* * * * *